United States Patent [19]

Booke et al.

[11] Patent Number: 5,171,964
[45] Date of Patent: Dec. 15, 1992

[54] HIGH ACCURACY, HIGH FLEXIBILITY, ENERGY BEAM MACHINING SYSTEM

[75] Inventors: Michael A. Booke, Poughkeepsie, N.Y.; Michael H. W. Kallmeyer, Boeblingen, Fed. Rep. of Germany; Nabil A. Rizk, Hopewell Junction; You-Wen Yau, Poughkeepsie, both of N.Y.

[73] Assignee: International Business Machines Corporation, Armonk, N.Y.

[21] Appl. No.: 745,313

[22] Filed: Aug. 15, 1991

Related U.S. Application Data

[63] Continuation of Ser. No. 557,444, Jul. 23, 1990, Pat. No. 5,124,522.

[51] Int. Cl.$^5$ .............................................. B23K 15/00
[52] U.S. Cl. ............... 219/121.19; 219/121.20; 219/121.31
[58] Field of Search ............... 219/121.19, 121.20, 219/121.26, 121.28, 121.29, 121.31, 121.34, 121.30

[56] References Cited

U.S. PATENT DOCUMENTS

| | | | |
|---|---|---|---|
| 3,134,010 | 5/1964 | Bettermann et al. | 219/69.1 |
| 4,066,863 | 1/1978 | Doran et al. | 219/121.26 X |
| 4,710,604 | 12/1987 | Shirasu et al. | 219/121.78 |
| 4,878,002 | 10/1989 | Heatzig et al. | 318/568.2 |

FOREIGN PATENT DOCUMENTS 56-42340 4/1981 Japan .

OTHER PUBLICATIONS

Digital Computer Applications to Process Control, Van Nauta Lemke, ed. 1977, pp. 655-662 "Computer Numerical Control of Electron Beam Machining Equipments".
Computer Designs Sep. 15, 1987, pp. 87-92.
Multiple OSPs provide speed for digital servo control.
Nuclear Instrum. and Methods in Phys. Res./B B37138 (1989) Feb. (II), No. 2, Amsterdam, NL "New Computer Control Sustem for the High Current Ion Implanter PR-80" pp. 548-551.
Optical Engineering 27(1988) Feb. No. 2, Bellingham, WA, USA pp. 143-149 Electron beam lithography and nanometer structures: fabricator of microzone plates.

Primary Examiner—C. L. Albritton
Attorney, Agent, or Firm—Donald M. Boles; Graham S. Jones, II

[57] ABSTRACT

A high precision system for machining substrates by means of an energy beam includes real time digital signal processor control and a deflection system providing control, within a predetermined field of the substrate, of the angle at which the beam machines the substrate. An electron beam is used in a vacuum chamber in a preferred embodiment. The system also includes an x-y table for positioning the substrate and may have provision for detecting the x-y position and angular misregistration of the substrate. Dynamic forms and stigmator control may be used to produce a uniform beam within the field. The system allows a high speed vector machining process, which optimizes the overall system throughput by minimizing the settling time of the deflection system.

49 Claims, 7 Drawing Sheets

5,171,964

HIGH ACCURACY, HIGH FLEXIBILITY, ENERGY BEAM MACHINING SYSTEM

This application is a continuation of Ser. No. 07/557,444 filed Jul. 23, 1990, now U.S. Pat. No. 5,124,522, issued Jun. 23, 1992.

TECHNICAL FIELD

The invention relates to methods and apparatus for machining a workpiece such as an electronic device substrate with the aid of a high energy beam. More particularly, in a preferred embodiment, this invention relates to methods and apparatus for accurately and rapidly producing holes and other features, which are smaller than those currently attainable by other methods, in an electronic substrate, using a real time digital signal processor control system.

DESCRIPTION OF THE PRIOR ART

In the current manufacture of multilayer ceramic (MLC) substrates for integrated circuit semiconductor package structures, a plurality of ceramic sheets is formed by doctor blading a slurry containing a resin binder, a particulate ceramic material, solvents, and a plasticizer, drying the doctor bladed sheet, and blanking it into appropriate sized sheets. Via holes are then mechanically punched for forming electrical interconnections through the sheet. Electrically conductive paste is deposited in the holes, and in appropriate patterns on the surface of the sheets, the sheets stacked and laminated, and the assembly subsequently fired at an appropriate sintering temperature. Punching the via holes in ceramic sheets presents formidable engineering problems in view of the small size, high density, and the complex patterns of the via holes. Apparatus used to perform these operations are described in Kranik, U.S. Pat. No. 4,425,829, and in Fleet, U.S. Pat. No. 4,821,614.

The mechanical punching technology currently used to manufacture MLC substrates has several limitations. The aspect ratio of a hole has traditionally been no less than one, that is the diameter has not been less than the thickness of the sheet to be punched. As the miniaturization of electronic devices continues, the requirement that smaller via holes be used increases. A certain minimum sheet thickness is necessary, however, for the mechanical integrity of the structure.

In addition to requiring smaller diameter holes, future electronics devices will require that the holes be spaced closer together. Use of a mechanical punch at these geometries causes greatly increased embossing of the green sheet, which can greatly distort the via pattern and positional accuracy. Existing technology limits the diameter of holes in MLC substrates to approximately 3.5 mils.

Given the requirement for smaller and more closely spaced features in MLC substrates, a need exists for an apparatus and a method which use advanced technology to manufacture substrates with the required geometries. This apparatus and method must be able to accurately and rapidly machine features in these substrates in order to provide the necessary feature geometries and yet remain competitive with existing mechanical devices such as the multiple-punch apparatus described in Kranik, U.S. Pat. No. 4,425,829.

One such advanced technology candidate for machining precision features is a laser beam. Examples of using lasers to drill holes in electronic substrates are described in Lassen, U.S. Pat No. 4,544,442, and in Kasner, U.S. Pat. No. 4,789,770. A system which combines a Nd:YAG machining laser with a HeNe positioning laser to accurately locate holes and other features is described in U.S. patent application No. 07/428,686, filed Oct. 30, 1989.

A high-intensity, focused beam of electrons can also be used to machine features. Steigerwald, U.S. Pat. No. 2,793,281, discloses an apparatus which uses an electron beam to drill holes. An improvement on this apparatus which use a program storage device coupled with digital decoders to control the drilling operation is described in Steigerwald, U.S. Pat. No. 2,989,614. Another improvement which uses a video scanner to control the drilling operation is disclosed in Schleich, U.S. Pat. No. 3,192,318.

Advances in electron beam technology have made it possible to drill precision holes with high speed. An electron beam application for semiconductor lithography in which a computer interface is used to correct beam deflection by imposing a varying electrostatic deflection onto a predetermined magnetic deflection is disclosed in Kruppa, U.S. Pat. No. 3,644,700. High speed electron drilling of printed circuit holes is disclosed in "High-Speed and Fine-Hole Processing Technology by a Pulsed Electron Beam," July, 1987, *Application Engineering*.

Another computer-controlled electron beam drilling application is disclosed in Hata, U.S. Pat. No. 4,467,170. In Hata, an electronics substrate is continuously translated along one axis while an electron beam sweeps back and forth in a raster pattern along the other axis. The extent of this sweep is limited because the hole becomes less perpendicular to the surface of the substrate as the sweep increases, thus distorting hole accuracy.

Electron beams can also be used to machine features other than holes in electronic substrates. The use of an electron beam to machine both via holes and other features such as channels in a ceramic substrate is described in Koste, "Electron Beam Processing of Interconnect Structures in Multi-Layer Ceramic Modules," *Metallurgical Transactions*, March, 1971, pp. 729-731. This machining is combined with providing a sheet of laminate over the substrate in order to provide an integral mask for a screening process in Koste, U.S. Pat. No. 3,956,052. Neither of these references describe the manner in which the machining process is controlled.

Current electron beam systems use a general purpose computer for process control, along with specialized interface circuits. The architecture of these computers is not optimized for real time control. Real time control requires that a processor give immediate response to an instruction. Inability of general purpose computers to perform real time control limits the effectiveness of these control systems in applications where many process variables must be simultaneously monitored and controlled.

Real time control systems are computationally intensive. Conventional computers and microprocessors rely on software simulation to perform arithmetic operations, resulting in multiple clock cycles for a single operation, eliminating the possibility of real time control. Even when this performance is enhanced, such as with the use of an arithmetic coprocessor, the storage of programs and data in the same space in conventional architecture dictates that data and instructions be fetched serially. The result is that an operation such as multiplication will require at least three clock cycles, one for the instruction fetch and one for each of the data fetches.

Digital signal processors (DSPs) are used for specific applications where computational speed and system flexibility are of primary importance. DSP architectures generally allow a multiplication and an addition to be performed in a single clock cycle in response to an instruction issued in the same clock cycle. DSPs may therefore be used to perform real time control. If processor cycle times continue to decrease will become possible to perform real time control with the instructions and computations on different clock cycles, although current DSPs do not operate in this manner. DSPs use a variety of internal configurations to insure that data is supplied to their arithmetic units in a timely manner. Several of these configurations are discussed in Martin, "Wave of advances carry DSP's to new horizons, "*Computer Design*," Sep. 15, 1987, pp. 69-83. By combining several DSP's in a custom system for particular applications, maximum flexibility and speed can be attained. Use of multiple DSP's in a digital servo controller for semiconductor wafer positioning is described in Contolini, "Multiple DSPs Provide Speed for Digital Servo Control," *Computer Design*, Sep. 15, 1987, pp. 87-92. A technique for the attachment of multiple DSP cards to an industrial computer for tool control is disclosed in Hammond, IBM Technical Disclosure Bulletin, Vol. 32, No. 5A, October, 1989, pp. 452-454.

SUMMARY OF THE INVENTION

Current energy beam machining systems show that a need exists to have a flexible real time control system which can precisely control all system functions to achieve greatest accuracy and speed. Current applications of DSP technology do not meet this need.

It is therefore an object of the present invention to provide a machining system using an energetic beam which uses real time DSP control to achieve precision machining at high speed.

It is a further object of the invention to control accurately the orientation at which this beam strikes a workpiece.

It is yet a further object of the invention to provide a method for machining a workpiece with an energetic beam which increases system throughput by deflecting the beam in an optimized manner to only those points on the workpiece which require machining.

It is still another object of the invention to personalize electronic substrates with an energy beam using real time DSP control without using a mask.

In accordance with these and other objects of the present invention, a high-precision system for machining substrates is provided which includes a source of an energy beam and means for forming, directing, and blanking the beam. The system also contains an x-y table which supports and positions a substrate to be machined by the beam. An important aspect of the system is a beam deflector for directing the beam at a predetermined angle to the substrate. The system is controlled by real time digital signal processors which control operative subsystems of the system.

The invention also provides a method for machining substrates with high precision which includes the steps of positioning a substrate on an x-y table, detecting the position of the substrate and its registration relative to a predetermined position, forming an electron beam opposite to the substrate, directing the beam at a predetermined angle to the substrate within a predetermined field of the substrate, thereby machining the substrate, and controlling at least the forming, directing, positioning, and detecting steps with real time digital signal processor control.

In a more particular embodiment, the invention provides a method of personalizing electronic substrates which includes the steps of applying a laminate to the surface of a substrate, positioning the substrate on an x-y table, detecting the position of the substrate, forming an electron beam opposite to the substrate, directing the beam at a predetermined angle to the substrate within a predetermined field of the substrate, thereby machining the substrate in a predetermined manner, and controlling at least the forming, directing, positioning, and detecting with real time digital signal processor control. After the predetermined field of the substrate is machined, the substrate is translated to a next field of the substrate and that field is machined using the same steps. After all fields of the substrate have been machined, metallization is screened onto the substrate over the laminate.

The foregoing and other objects, features, and advantages of the invention will be apparent from the following more particular description of a preferred embodiment of the invention as illustrated in the accompanying drawings.

BRIEF DESCRIPTION OF THE DRAWINGS

In the accompanying drawings forming a material part of this disclosure.

DETAILED DESCRIPTION OF THE INVENTION

Figure 1:
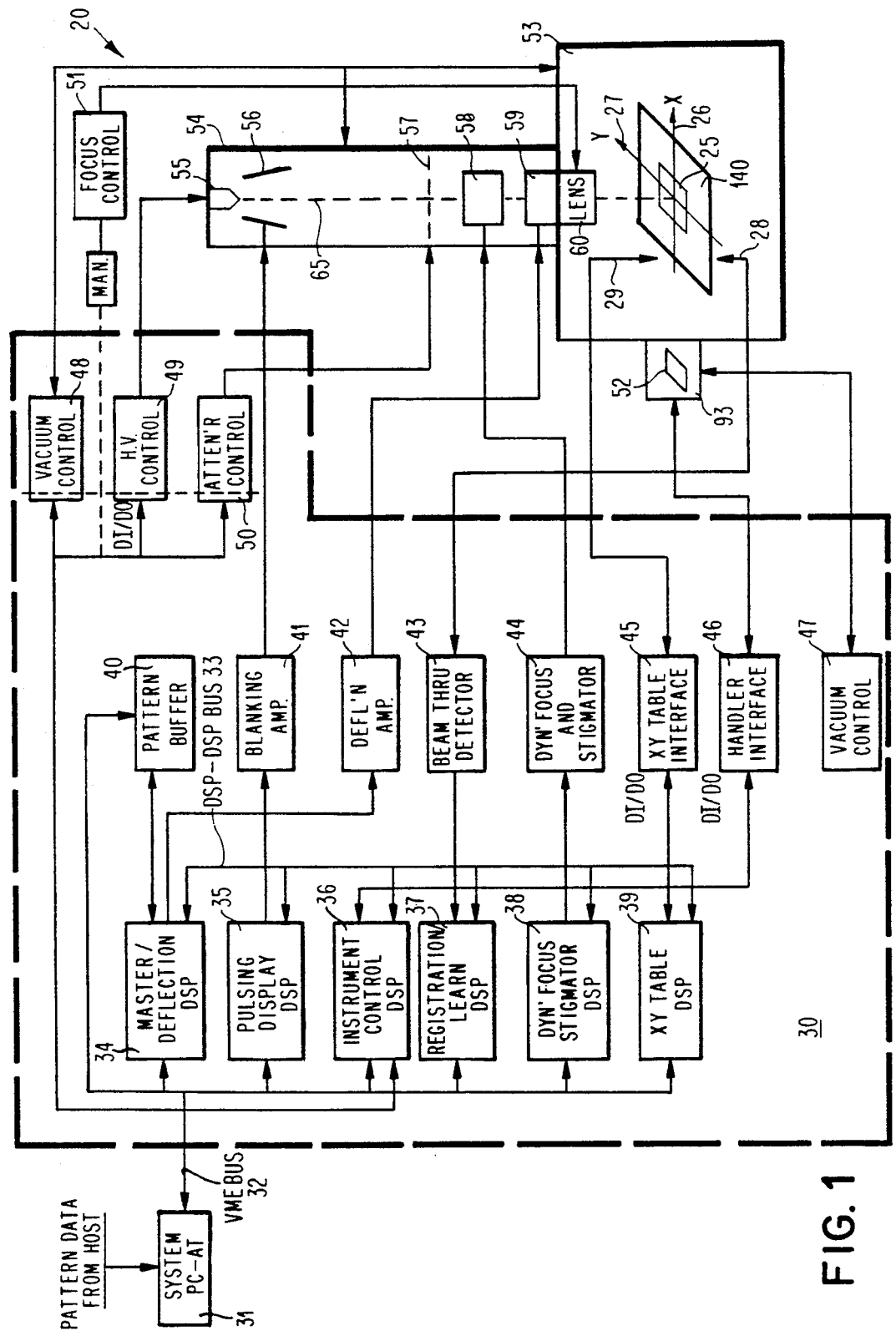
FIG. 1 is a schematic block diagram of the system comprising the present invention.

Referring to the drawings in more detail and particularly referring to FIG. 1 of the invention, there is shown the machining system 20 according to the present invention. The machining system 20 comprises a source 55 of an energy beam 65 and preferably includes means for forming, directing, and blanking the beam. The machining operations performed by the system may include, but are not limited to, drilling, removing material to form channels or the like, or sculpting a workpiece. The beam 65 may be of a pulsed or continuous nature. For the purposes of the present invention, the preferred high energy beam is an electron beam with a voltage range from 60 kV to 150 kV. It should be understood, of course, that the choice of this electron beam is not exhaustive as there are other voltage ranges of electron beams and other types of beams, such as lasers, which will adequately fulfill the objects of the present invention.

The forming means are controlled by the high voltage control 49, and may include a precision power supply. In a preferred embodiment, this power supply controls the output voltage ripple of the beam to within +/−24 V over a voltage range of 60 kV–120 kV, which is the primary, although not exclusive, operating range of the system of the invention. This tightly controlled ripple voltage allows precision control of the beam size, since the composition of the beam is directly affected by the voltage ripple.

The directing means may also include a dynamic focus and stigmator 58 for producing a uniform beam within a predetermined field, the function of which will become more clearly understood hereinafter. The blanking means may include blanking electrodes 56, which act to shut off the beam in a predetermined manner, in response to signals from a blanking amplifier 41. Next, the machining system comprises an x-y table 140, preferably located opposite to the beam source 55, which includes means for supporting and positioning a substrate 25 to be machined by the beam. The substrate selection may include an electronics substrate, in particular a ceramic green sheet, this example of course being for purposes of illustration and not of limitation. The positioning means can translate the substrate 25 along an x-axis 26 and along a y-axis 27, although other translations and rotations are contemplated within the scope of the present invention.

The system preferably includes a vacuum chamber, the vacuum of which is controlled by vacuum control 48. In a preferred embodiment, the vacuum chamber is composed of a first part 53, which encloses at least the portion of the x-y table 140 providing substrate supporting means 25 of the x-y table 140. The second portion of the vacuum chamber comprises the beam column and encloses the beam source 55.

A substrate handling subsystem for storing and transferring the substrate 25 into and out of the vacuum chamber 53 may also be provided, the handling subsystem including a handling chamber 93 in selective vacuum contact with the vacuum chamber 53. A second substrate 52 is located in the handling chamber 93, which replaces the substrate 25 on the x-y table 140 when machining of the substrate 25 is complete. The operation of the handling subsystem will become more apparent hereinafter.

The system next may comprise means for detecting the position of the substrate 25 within the vacuum chamber 53. The detecting means include a laser interferometer 29 and x-y table interface 45. Beam through detector means 28, 43 may also be provided for determining substrate registration relative to a predetermined position and for determining when features have been machined through the substrate.

An important aspect of the system is beam deflection means for directing the beam at a predetermined angle to the substrate 25. In many machining applications, such as for drilling holes in electronic substrate, this means is used to insure that the beam is perpendicular to the substrate. The effect of non-perpendicularity will be explained further hereinafter. The deflection means operate when machining within a predetermined field of the substrate and may include deflection coils 59 and a telecentric lens 60. The predetermined field of the substrate may encompass the entire substrate but is usually a small subsection of the substrate. The focus of the lens may be manually adjusted by focus control 51.

A most important component of the present invention is the real time digital signal processor (DSP) control means 30 for controlling operative sub-systems of the system, which in the preferred embodiment may include control of the forming, directing, blanking, positioning, and detecting means, as well as control of the deflection and handling subsystems. The use of the DSP control system allows computational speed, system flexibility, and real time operation not found in prior art electron beam control systems for machining applications.

In a preferred, although certainly not exclusive, embodiment, the control means comprises a plurality of DSP cards 34-39 operatively connected by a VME bus 32, a standard industrial control bus which is well known to those skilled in the art, to a computer 31. The VME bus hardware in the preferred embodiment was supplied by BICC Electronics Gmbh. The computer 31 provides an operator interface, the computer containing at least substrate machining data, memory, and input-/output means. The computer could be a personal computer such as the PC-AT, manufactured by International Business Machines Corporation, which was used in the preferred embodiment, with machining data downloaded from a larger host system computer. The computer could also be a larger computer or another type of personal computer without any further data communication to other computers. The DSP cards are connected to and provide operative commands to interfaces 40-50 and through these interfaces to the controlled subsystems of the system. The DSP cards are connected to each other by a high speed DSP-DSP bus 33.

Another feature of the preferred embodiment of the invention is the pattern buffer means 40, which may be used to provide high speed memory access of substrate machining data to the DSP card control means 30. The pattern buffer 40 thus acts as a high speed memory bank for the DSPs, the machining data for a particular substrate being loaded into the pattern buffer 40 from the computer 31 over the VME bus 32.

The DSP control means 30 thus control the entire system's operation. For example, in the preferred embodiment shown in FIG. 1, the instrument control DSP 36 and the high voltage control 49 provide first controlling means for controlling voltage to create the beam. The dynamic focus and stigmator DSP 38 and the dynamic focus and stigmator controller 44 provide second controlling means for controlling dynamic focus and astigmatism to produce a uniform beam. The pulsing display DSP 35 and the blanking amplifier 41 provide third controlling means for controlling the beam blanking electrodes 56. The instrument control DSP 36 and the vacuum controller 48 provide fourth controlling means for controlling vacuum in the vacuum chambers 53, 54. The x-y table DSP 39, the x-y table interface 45, and the laser interferometer 29 provide first detecting means for detecting the substrate x-y position, in addition to providing means to control x-y table movements in response to commands to move the table from one drilling field to the next. The registration/learn DSP 37 and the beam through detector 43 provide second detecting means for determining substrate registration relative to a predetermined position. The instrument and control DSP 36, the handler interface 46, and the vacuum controller 47 provide fifth controlling means for controlling the substrate handling subsystem. The master/deflection DSP 34 and the deflection amplifier 42 provide master controlling means for controlling the deflection coils 59.

Inter-DSP communication over the DSP-DSP bus 33 in response to detected signals allows the control means 30 to provide, in a manner which will become clear hereinafter, means for calculating deflection distortion correction, means for calculating x-y table error correction, means for calculating registration of the substrate relative to a predetermined position error correction, comparing means for accumulating the distortion correction, the table correction, and the registration correction, and for comparing the accumulated correction with predetermined feature locations, and correcting means for correcting beam deflection to compensate for the accumulated correction, the correcting means responsive to the comparing means.

Figure 3:
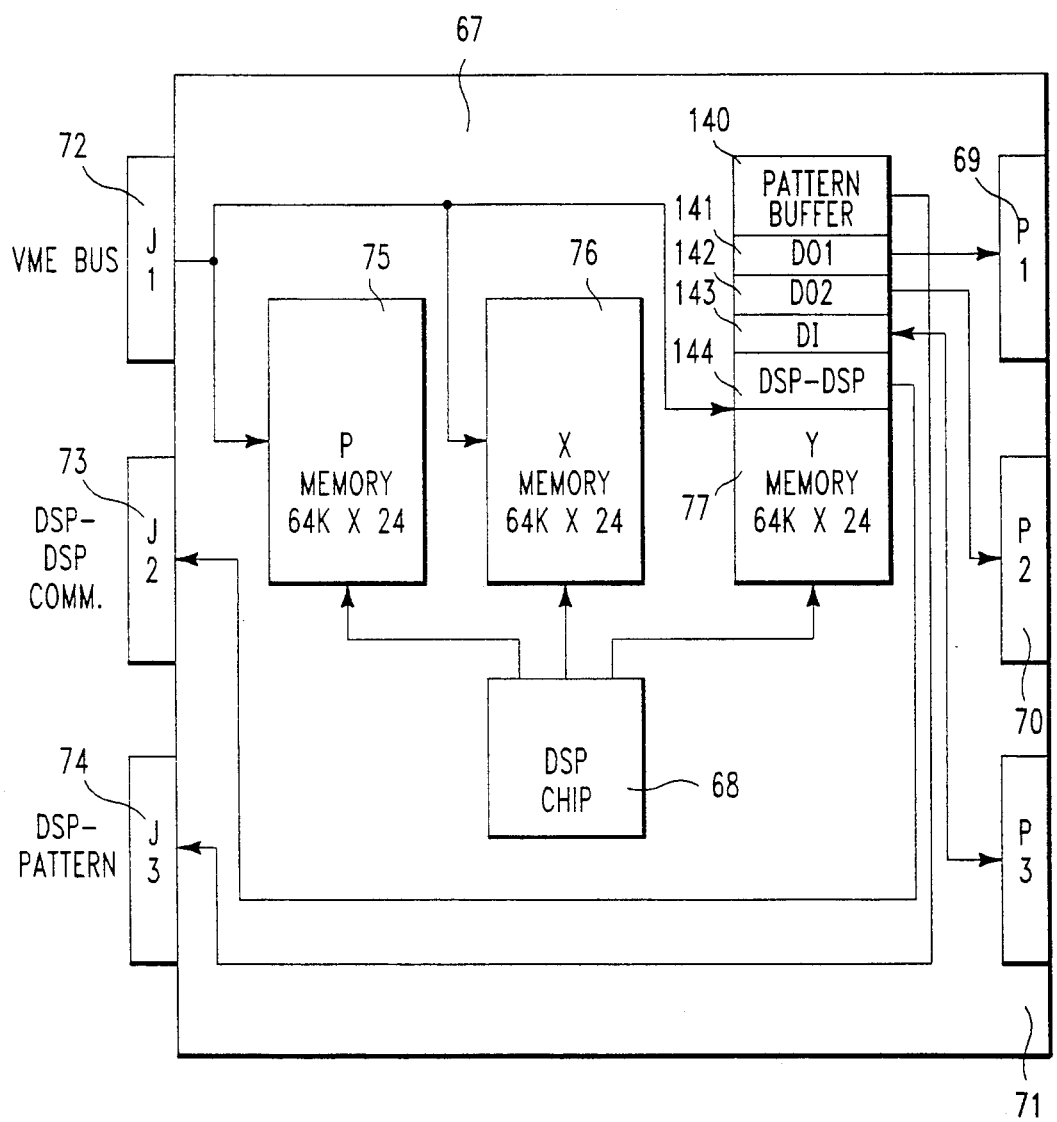
FIG. 3 is a schematic diagram of one of the DSP cards.

FIG. 3 shows a block diagram of the DSP card 67 used in the preferred embodiment. In this embodiment, the same hardware is used for DSP cards 34-39. The DSP chip 68 used was a DSP56001, manufactured by Motorola, Inc. With this DSP an instruction prefetch, a 24×24 bit multiplication, a 56 bit addition, two data moves, and two address pointer updates using one of three types of arithmetic (linear, modulo, or reverse carry) can all be executed in a single instruction cycle. This DSP provides powerful real time control capability.

The DSP chip 68 is connected to three on-card memory banks for rapid data manipulation, the Program Memory 75, the X memory 76, and the Y memory 77. Data and instructions are input to these memories from the VME bus connector 72. Communication with the pattern buffer 40 is routed through the pattern buffer interface 140 and the DSP-Pattern connector 74. Data output commands to the subsystem interfaces and controllers are routed through the DO1 141 and DO2 142 interfaces and the P1 69 and P2 70 connectors. Data input communication to these entities is routed through the DI interface 143 and the P3 connector 71. The DSP-DSP interface 144 provides random access communication to other DSP cards through connector J2 73.

Figure 12:
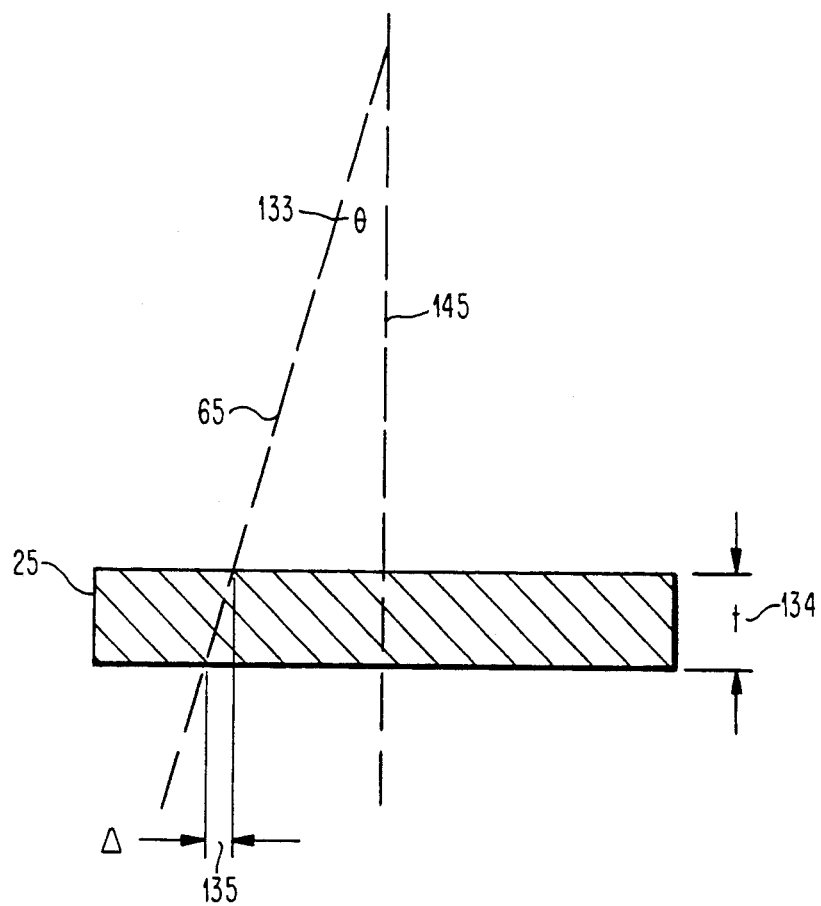
FIG. 12 depicts hole inaccuracy due to non-perpendicular beam deflection.

The beam deflection means, as hereinbefore mentioned, is critical in ensuring that the beam strikes the substrate at a predetermined angle. The effect on hole accuracy when accurate control of the angle is not achieved is demonstrated in FIG. 12. In the configuration in this figure, it is desired that the beam 65 drill holes in the substrate 25 which are perpendicular to the substrate. If deflections of the beam are not accomplished in a manner which ensures perpendicularity, an error will exist in any hole which is not located along the perpendicular line 145 from the beam source to the substrate.

As an example of this effect, consider a hole at an angle $\theta$ 133 from the line 145 through the substrate 25 of thickness t 134. The error delta 135 is equal to t multiplied by tan $\theta$, or for the small angles typically involved, is approximately equal to t multiplied by sin $\theta$. In cases where it is desired to drill holes as small as 1 mil with an overall positional accuracy of 10 microns, the error introduced by this effect is unacceptable. For example, in Hata, U.S. Pat. No. 4,467,170, this effect limits the allowable range of deflection to +/−3 mm.

Figure 2:
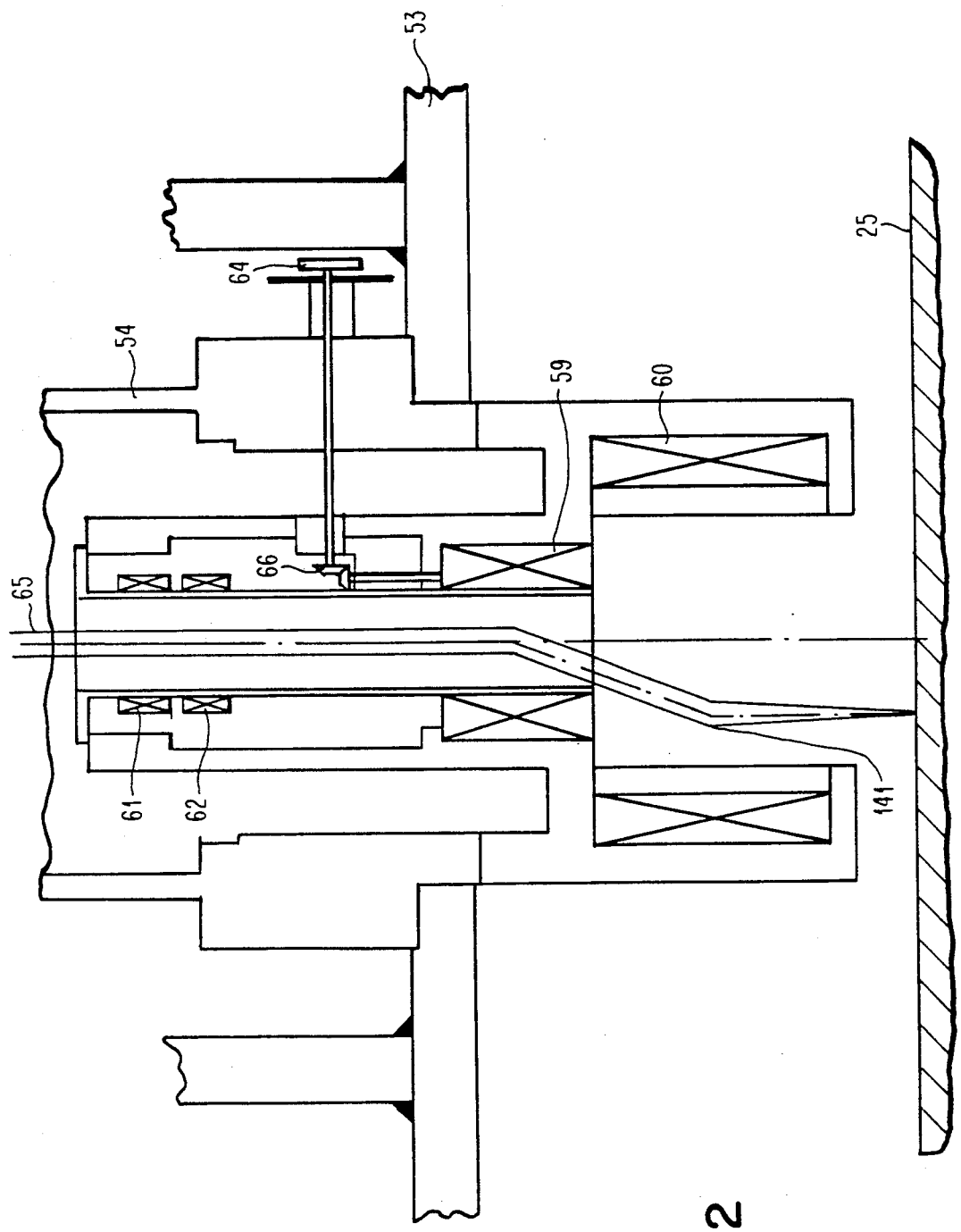
FIG. 2 schematically shows the focus, stigmator, and deflection optics located in the electron beam column.

The telecentric deflection system of the current invention solves this problem. Referring to FIG. 2, a portion of the electron beam column 54 is shown. The beam 65 is first appropriately adjusted by the dynamic stigmator 61 and dynamic focus 62. The beam then passes through the deflection coil 59 and is deflected in response to a signal from the master/deflection DSP 34. The deflection coil can be manually rotationally adjusted by knob 64, which acting through bevel gears 66, rotates the deflection coil 59, to adjust the beam deflection directions. The beam then enters the telecentric lens 60, which has a focal length 141 which is designed to insure that the beam 65 always strikes the substrate 25 at the same angle, within the allowed range of deflections. In the example shown in the figure, this angle is a right angle to the substrate. This example, of course, is for purposes of illustration and not of limitation. In the preferred embodiment, this allows machining at a predetermined angle within a field of about 15 mm. It should be understood that this can be increased as necessary by an appropriate selection of lenses and deflection coils.

Figure 8:
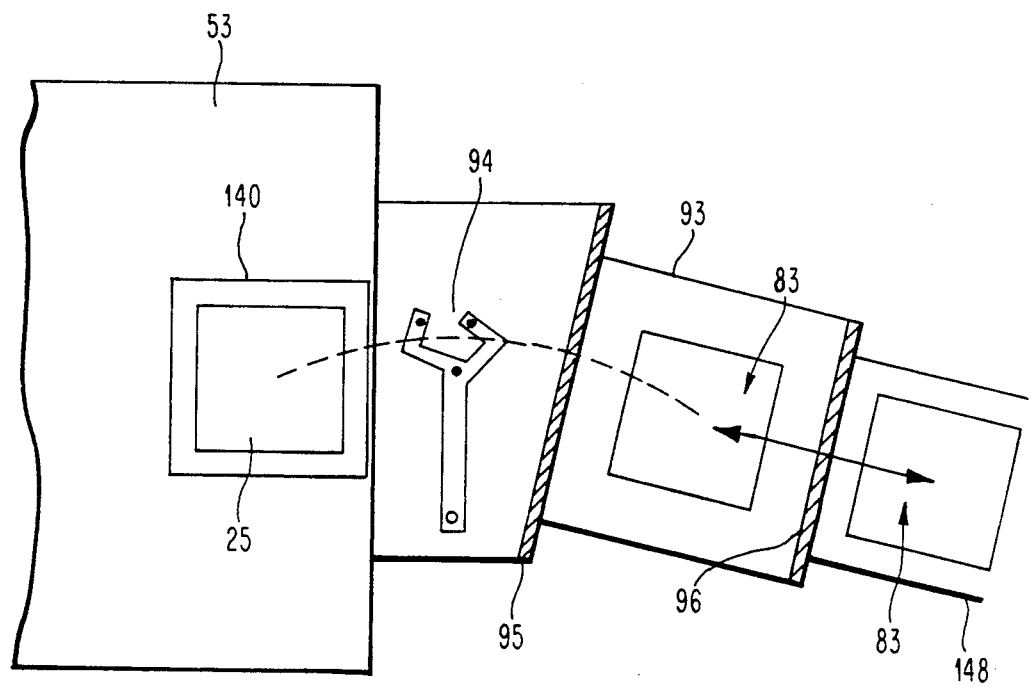
FIG. 8 depicts a substrate handling subsystem of the present invention.

Having described the system hardware, the operation of the system will now be explained in further detail. This description describes a preferred embodiment and is for purposes of illustration of the operation of the invention, not for limitation. Referring to FIG. 8, a fixture 83 containing a substrate (not shown) is placed on the load/unload shuttle 148. The fixture is then transferred through high vacuum valve 96 into handling chamber 93, which is at atmospheric pressure. After the pressure in the handling chamber 93 is equalized with the pressure in vacuum chamber 53, the fixture 83 and the substrate are transferred through high vacuum valve 95 onto the x-y table 140 in the vacuum chamber 53 by transfer arm 94. Although not shown in the figure, a machined substrate may be removed from the chamber in a similar manner at a different vertical level of the handling chamber 93 system simultaneous with the placement of the substrate 25 into the chamber 53.

Figure 4:
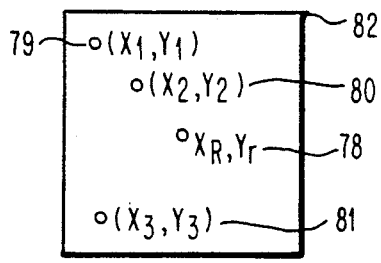
FIG. 4 shows a machining field of substrate with several machining positions and their accompanying coordinates.
Figure 5:
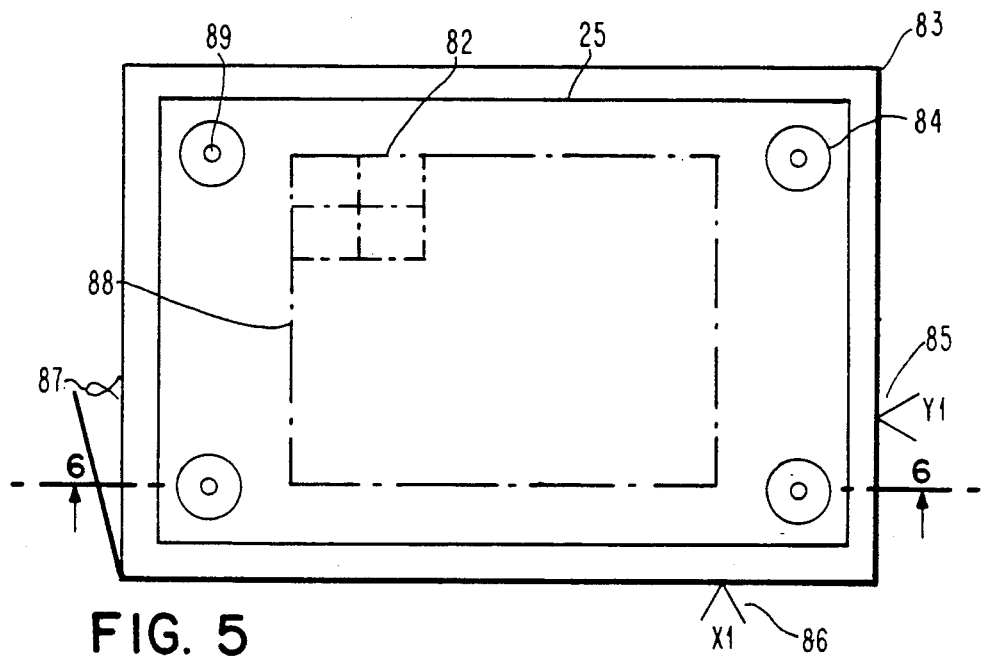
FIG. 5 schematically shows a substrate mounted on a machining fixture.
Figure 6:
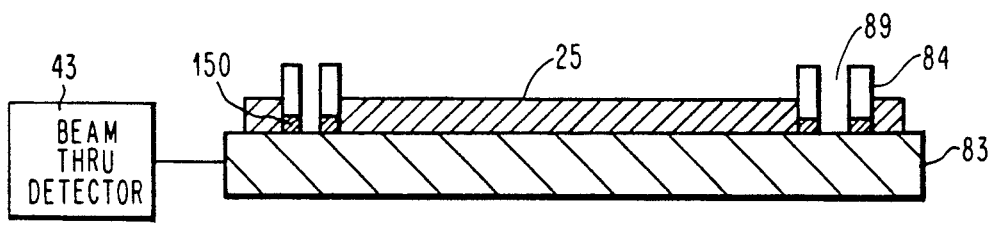
FIG. 6 is a section of FIG. 5 taken at 6—6.

The system is calibrated before machining begins. As shown in FIGS. 5 and 6, the substrate 25 is mounted on the fixture 83 over a set of precision pins 84. The area of the substrate to be machined 88 is divided into fields 82. As shown in FIG. 4, each field 82, has a reference point 78, with coordinates $x_r$ and $y_r$. Referring again to FIG. 5, the fixture 83 has an x-reference point $x_1$ 86 and a y-reference point $y_1$ 85. It is possible that the substrate may be misregistered on the x-y table by an angle alpha 87.

The registration error must first be calculated, which entails scanning the beam across the substrate. Referring to FIG. 1, an attenuator 57 is placed across the beam path in response to a signal from the attenuator controller 50. The attenuator 57 blocks most of the beam energy from contacting the substrate while the registration scan is underway. Referring again to FIGS. 5 and 6, the precision pins 84 have a central hole 89 and are insulated from the fixture 83 backing plate by insulators 150. The x-y table is sequentially translated so that the location of each hole 89 corresponds to the predetermined center line of the beam. The beam scans until it actually passes through the hole 89, contacting the backing plate 83 and thus registering on the beam through detector 43. This hole detection means may also be used to provide an indication that a feature has been machined completely through the substrate. After detecting the hole 89 position for each pin 84 and referring again to FIG. 1, the actual locations are compared with the desired predetermined position in the registration/learn DSP 37. An appropriate correction to the beam deflection can then be made by the master/deflection DSP 34 for any error due to misregistration. The attenuator 57 is then withdrawn from the beam path.

The x-y table is then translated so that the position of the substrate on the x-y table is such that the center of the beam deflection field corresponds to the reference point 78. The position of Y1 85 and X1 86 is detected by a laser interferometer, either by direct exposure or through a suitable arrangement of mirrors. This information is communicated to the x-y table interface 45 and the x-y table DSP 39. The actual location thus detected is compared with the desired location and an appropriate correction calculated so that the beam deflection can compensate for any error which may exist.

Figure 7:
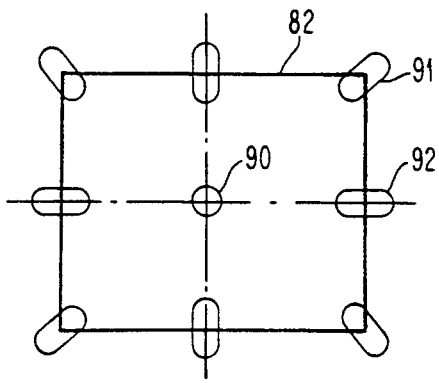
FIG. 7 depicts in an exaggerated manner the astigmatism problem of an uncorrected beam within a field.

The focus and the astigmatism of the beam must also be periodically calibrated. Referring to FIG. 7, a field 82 of the substrate 25 is shown. Without focus and astigmatism control, any beam spot not in the center 90 of the field, such as those at the far right 92 and upper right 91, will not be uniform, although the variation shown in the Figure is greatly exaggerated. An initial calibration will determine the amount of focus and astigmatism control at each point in the field, which can then be dynamically adjusted by the dynamic focus and stigmator DSP in response to commands from the master deflection DSP as the beam is deflected.

The deflection coil and telecentric lens characteristics are also determined and necessary deflection distortion correction values input to the master deflection DSP. The master deflection DSP accumulates all of these correction values and issues commands to the deflection amplifier which deflects the beam to compensate for these accumulated corrections. It should be noted that although the reference positions in the preferred embodiment for the described corrections are variously located on the substrate and fixture, these positions are for purposes of illustration and not for limitation.

Once these characterizations and calibrations are performed, the substrate can be machined. In the preferred embodiment 1200 holes were machined in an 8 mil thick ceramic glass sheet within 0.83 seconds with a total positional accuracy of 10 microns. Holes as small as 1 mil can be machined in this material with the system of the present invention. The 10 micron accuracy includes positional tolerances of the fixturing as well as beam deflection tolerances.

After a field is machined, the x-y table translates to the next field. An entire green sheet containing over 100,000 holes can be machined in less than two minutes. The speed and accuracy of this system demonstrate the effectiveness of the real time DSP control system.

As seen from the preceding description of the system, the system provides a method of machining substrates, which may include drilling holes in a substrate using an electron beam. The first step in this method is positioning the substrate on an x-y table in such a manner so that it may be machined or drilled by the beam. A further step which may be provided is to detect the position of the substrate and its registration relative to a predetermined position which may be performed using a laser interferometer and a beam through detector An electron beam is formed opposite to the substrate. The most precise beam is formed using a power supply with a substantially $+/-24$ V regulated voltage over a voltage range of 60 kV-120 kV. The forming step may also include dynamically controlling the beam focus and astigmatism. It is preferable to enclose at least the portion of the x-y table supporting the substrate and the source of the beam in a vacuum chamber. The beam is directed at a predetermined angle to the substrate, thereby machining the substrate. For drilling, this angle is preferably a right angle to the substrate. This directing step may be performed using deflection coils and a telecentric lens. At least the forming, directing, positioning, and detecting steps are controlled using real time digital signal processors (DSPs). The machining data may be stored in a pattern buffer in communication with the DSP's. The process may also include storing and transferring the substrate into and out of a vacuum chamber with a handling subsystem in selective vacuum contact with the vacuum chamber As can be seen from the preceding description of the operation of the system, the controlling step may also include calculating deflection distortion correction, calculating x-y table error correction, calculating registration of the substrate relative to a predetermined position error correction, accumulating the distortion correction, the table correction, and the registration correction, comparing the accumulated correction with predetermined feature locations, and correcting beam deflection to compensate for the accumulated correction responsive to the comparing step.

Figure 11:
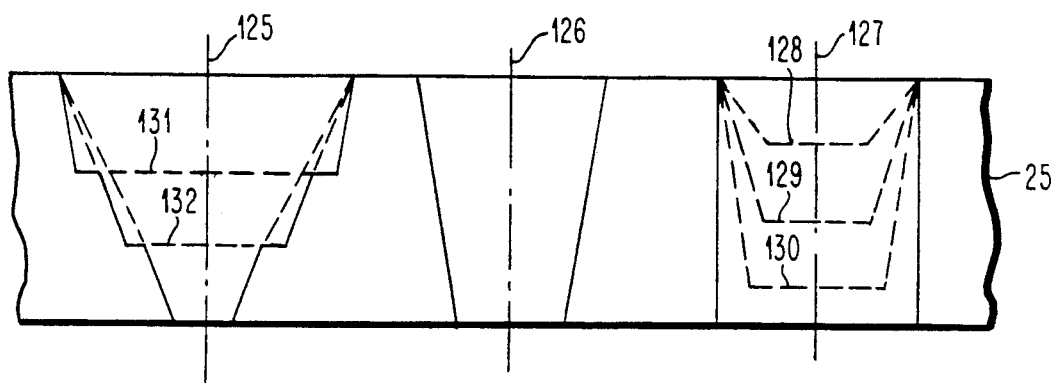
FIG. 11 depicts a series of holes drilled in a manner which customizes the hole profile.

The machining process of the present invention operates by thermal material removal. In prior systems, it has been observed that when drilling a hole the diameter of the hole decreases as the hole depth increases. Referring to FIG. 11, hole 126 is such a tapered hole. This is undesirable when several substrates must be aligned and attached, since the non-uniformity of the hole may cause misregistration error. Three factors influence the thermal energy of the beam: beam voltage, beam current, and pulse width The flexible DSP control system of the present invention allows variation of pulse width to achieve desired hole profiles Accordingly, the present invention may further comprise selectively pulsing the beam in response to DSP signals to machine the substrate. Varying these pulse widths allows tailoring hole profiles in a predetermined manner. Hole 127 is machined in this manner. A first pulse of a predetermined pulse width machines a portion 128 of the hole. Subsequent pulses of successively increasing pulse width are used to machine subsequent portions 129, 130 of the hole. The final pulse of the largest pulse width completes the hole 127. In this manner a straight walled hole can be machined. It should be understood that the use of four pulses in the example is for purposes of illustration only and not for the purpose of limitation.

The tapered hole 126 could also be achieved by successive pulses of substantially equivalent pulse width. If a greater taper is desired, successively decreasing pulse width can be applied to produce a hole 125 with portions 131, 132 of successively greater taper.

The machining process described can be accomplished in either a raster or in a vector mode. In a raster mode the beam is deflected to each pixel in a field and unblanked only in those pixels in which a machining operation is desired. This method is inefficient if the machining feature density is not high. For example, a 15 mm×15 mm field may have 360,000 pixels but only 1,200 machined features. In this configuration, the vector mode may be more desirable. In the vector mode, the beam is deflected to only those pixels where machining operations are required. Referring to FIG. 4, a field 82 is shown with a reference point 78 and several machining points 79, 80, 81. In a field such as this, vector machining is the most efficient method Whenever a beam is deflected from one point to another, the machining operation must be delayed to account for the settling of the deflection yoke. This settling time is a function of the yoke material and deflection size. In the vector machining mode, it is desirable to minimize the settling time to optimize system throughput.

Figure 10:
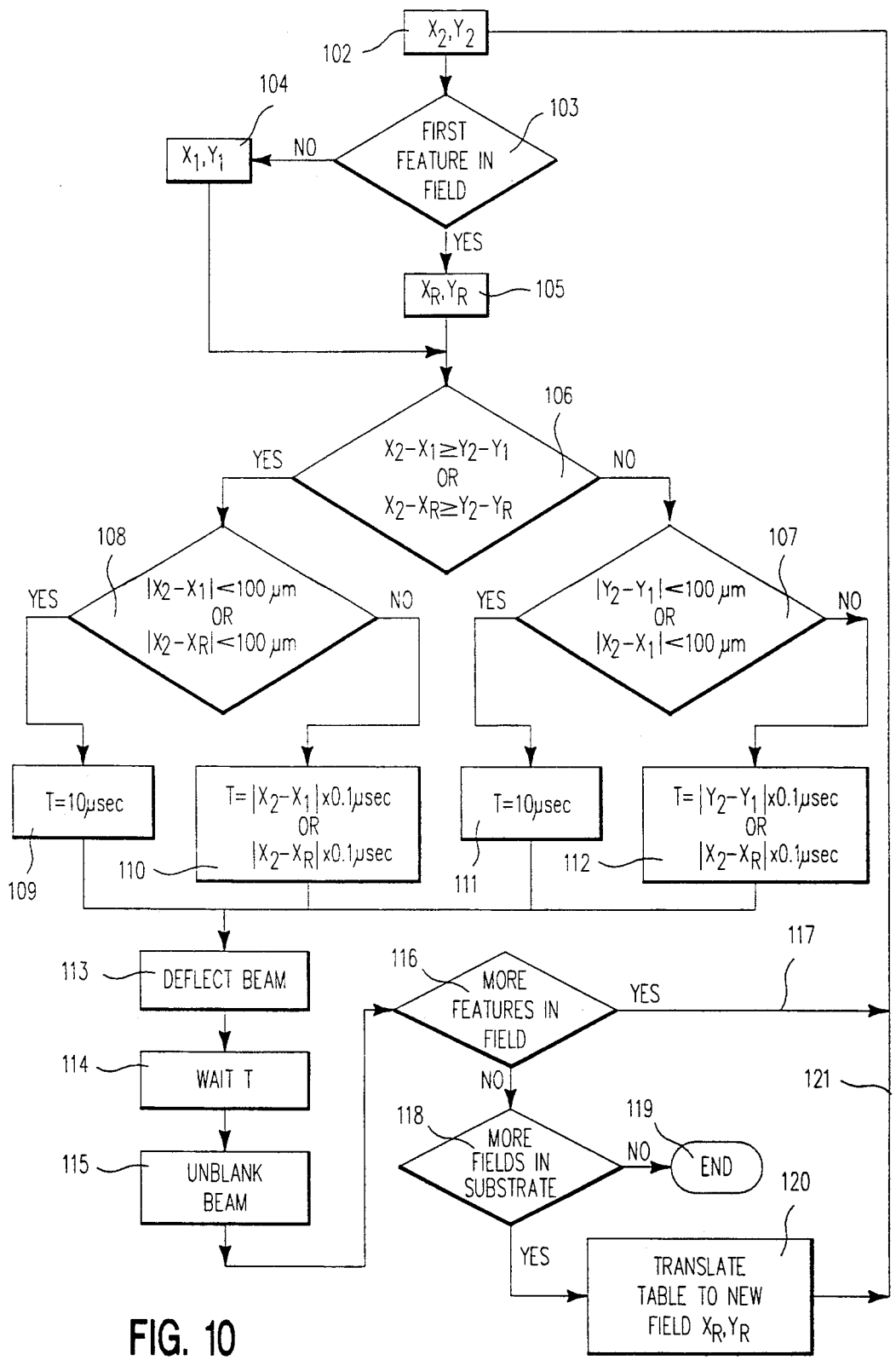
FIG. 10 is a flow diagram of a procedure of the present invention which minimized machining time.

Referring to FIG. 10, the present invention provides a method for machining features to optimize system throughput. The first step is to fetch x-y coordinates 102 of a predetermined feature location This fetch could be made from the pattern buffer of the present invention to the master/deflection DSP, but could also be made from any memory device to any computational device. These coordinates are then compared 106 with reference x-y coordinates 105 if the predetermined feature is the first feature 103 in the field, or compared with the x-y coordinates 105 from the immediately preceding machined feature in the field if the predetermined feature is not the first feature in the field to be machined. This comparison may be achieved by subtracting $X_1$ from $X_2$ or $X_r$ from $X_2$ and comparing the result with the difference of Y2 and Y1 or $Y_2$ and $Y_r$. The larger x and y translation distance is used to determine the yoke settling time.

A settling time is then calculated. If the larger of the x and y distances does not exceed a predetermined value 108, 107, the settling time is set at a fixed predetermined value 109, 111. In a preferred embodiment, the predetermined distance and time are 100 micrometers and 10 microseconds, respectively. If the larger of the x and y distances does exceed the predetermined value, a yoke settling time is calculated using a predetermined formula 110, 112. In a preferred embodiment, the settling time is determined by multiplying the larger of the x and y translation distances in micrometers by 0.1 microsecond.

Once the settling time is calculated, the beam is deflected 113 to the x-y coordinates of the predetermined feature, the system waits the calculated settling time 114, and the beam is unblanked 115, thereby machining the desired feature. If there are more features to be machined in the field 116, this process is repeated 117 until all features in the field are machined. If there are no more features to be machined in the field 118, the substrate is translated 120 to the reference x-y coordinates of the next field to be machined. The field machining process is then repeated 121 for the new field. When all fields on the substrate are machined, the process is complete 119.

Figure 9A:
FIGS. 9A-9D show the steps of a maskless substrate personalization process.
Figure 9C:
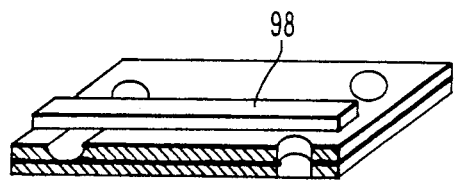
Figure 9B:
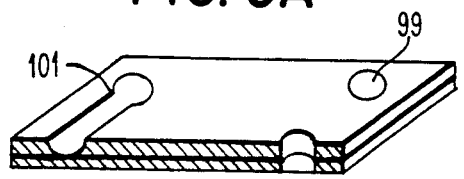

The present invention also provides a method of maskless personalization of electronics substrates. Referring to FIG. 9, a laminate 97 is applied to the surface of the substrate 25 in FIG. 9A. The substrate is then positioned on an x-y table, the position of the substrate is detected, an electron beam is formed opposite to the substrate, and the electron beam is directed at a predetermined angle to the substrate, within a predetermined field of the substrate, thereby machining the substrate. These machined features 99, 101 are shown in FIG. 9B.

Figure 9D:
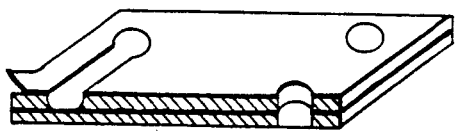

At least the forming, directing, positioning, and detecting steps are controlled with real time digital signal processor control. After the predetermined field is machined, the x-y table is translated to the next field of the substrate. The entire series of steps is repeated until all fields of the substrate have been machined. As shown in FIG. 9C, metallization is then screened 98 onto the substrate 25 over the laminate 97, the laminate acting as a mask. It may be desired, although not necessary, to remove the laminate, as shown in FIG. 9D.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. A high precision system for machining substrates comprising:
    a source of an energy beam;
    an x-y table including means for supporting and positioning a substrate to be machined by said beam;
    beam deflection means for directing said beam at a predetermined angle to said substrate;
    real time digital signal processor (DSP) control means for controlling operative subsystems of said system, and
    beam through detector means for determining substrate through feature presence.

2. The system of claim 1 wherein the energy beam source comprises an electron beam source.

3. The system of claim 2 further comprising means for forming, directing, and blanking the beam.

4. The system of claim 3 further comprising a vacuum chamber enclosing at least the substrate supporting means of the x-y table and the beam source.

5. The system of claim 4 further comprising laser interferometer detecting means for detecting the position of the substrate.

6. The system of claim 5 further comprising said beam through detector means determining substrate registration relative to a predetermined position.

7. The system of claim 6 further comprising dynamic focus and stigmator means for producing a uniform beam within a predetermined field.

8. The system of claim 7 wherein the beam deflection means comprises deflection coils and a telecentric lens.

9. A high precision system for machining substrates comprising:
    an electron beam source;
    means for forming, directing and blanking said beam;
    dynamic focus and stigmator means for producing a uniform beam within a predetermined field;
    beam deflection means for directing said beam at a predetermined angle to a substrate, said beam deflection means comprising deflection coils and a telecentric lens;
    an x-y table including means for supporting and positioning a substrate to be machined by said beam;
    a vacuum chamber enclosing at least said substrate supporting means of said x-y table and said beam source;
    laser interferometer detecting means for detecting said position of a substrate;
    beam through detector means for determining substrate registration relative to a predetermined position and for detecting substrate through feature presence;

real time digital signal processor (DSP) control means for controlling operative subsystems of said system, and a substrate handling subsystem for storing and transferring a substrate into and out of said vacuum chamber, said handling subsystem including a handling chamber in selective vacuum contact with said vacuum chamber.

10. The system of claim 9 further comprising a computer in communication with the DSP control means, the computer configured to provide substrate machining data and to provide an operator interface to the DSP control means.

11. The system of claim 10 further comprising pattern buffer means for providing high speed substrate machining data memory access to the DSP control means, the machining data loaded into the pattern buffer means from the computer.

12. The system of claim 11 wherein the forming means includes a power supply producing a substantially +/−24 V ripple regulated voltage over the voltage range of 60 kV–120 kV.

13. The system of claim 2 further comprising a computer and wherein the DSP control means comprises a plurality of digital signal processor (DSP) cards operatively connected by a VME bus to the computer providing an operator interface, the computer containing at least substrate machining data, memory, and input/output means, the DSP cards further connected to controlled subsystems of the system, and the DSP cards connected to each other by a DSP-DSP bus.

14. The system of claim 13 further comprising a vacuum chamber enclosing at least the substrate supporting means of the x-y table and the beam source.

15. The system of claim 14 further comprising laser interferometer detecting means for detecting the position of the substrate.

16. The system of claim 15 further comprising beam through detector means for determining substrate registration relative to a predetermined position and for detecting substrate through feature presence.

17. The system of claim 16 further comprising dynamic focus and stigmator means for producing a uniform beam within a predetermined field.

18. The system of claim 17 wherein the beam deflection means comprises deflection coils and a telecentric lens.

19. A high precision system for machining substrates comprising:
a source of an energy beam comprising an electron beam source;
an x-y table including means for supporting and positioning a substrate to be machined by said beam;
beam deflection means for directing said beam at a predetermined angle to said substrate;
real time digital signal processor (DSP) control means for controlling operative subsystems of said system,.
a computer and wherein said DSP control means comprises a plurality of digital signal processor (DSP) cards operatively connected by a VME bus to said computer providing an operator interface, said computer containing at least substrate machining data, memory, and input/output means, said DSP cards further connected to controlled subsystems of said system, and said DSP cards connected to each other by a DSP-DSP bus, a vacuum chamber enclosing at least said substrate supporting means of said x-y table and said beam source, laser interferometer detecting means for detecting said position of a substrate, beam through detector means for determining substrate registration relative to a predetermined position and for detecting substrate through feature presence, dynamic focus and stigmator means for producing a uniform beam within a predetermined field, said beam deflection means comprises deflection coils and a telecentric lens, and a substrate handling subsystem for storing and transferring said substrate into and out of said vacuum chamber, said handling subsystem including a handling chamber in selective vacuum contact with said vacuum chamber.

20. The system of claim 19 wherein the forming means includes a power supply producing a substantially +/−24 V ripple regulated voltage over the voltage range of 60 kV–120 kV.

21. The system of claim 19 further comprising pattern buffer means for providing high speed substrate machining data memory access to the control means across the VME bus, the machining data loaded into the pattern buffer means from the computer across the VME bus.

22. The system of claim 2 wherein the DSP control means comprises:
means for calculating deflection distortion correction;
means for calculating x-y table error correction;
means for calculating registration of the substrate relative to a predetermined position error correction;
comparing means for accumulating the distortion correction, the table correction, and the registration correction, and for comparing the accumulated correction with predetermined feature locations; and
correcting means for correcting beam deflection to compensate for the accumulated correction, the correcting means responsive to the comparing means.

23. The system of claim 4, wherein the DSP control means comprises:
first controlling means for controlling voltage to create the beam;
second controlling means for controlling dynamic focus and astigmatism to produce a uniform beam;
third controlling means for controlling the blanking means;
fourth controlling means for controlling vacuum in the vacuum chamber;
first detecting means for detecting the substrate x-y position;
second detecting means for determining substrate registration relative to a predetermined position;
fifth controlling means for controlling a substrate handling subsystem; and
master controlling means for controlling the deflection means.

24. A high precision system for machining substrates comprising:
a source of an energy beam;

an x-y table including means for supporting and positioning a substrate to be machined by the beam;

a vacuum chamber enclosing at least the substrate supporting means of the x-y table;

detecting means for detecting the position of the substrate within the vacuum chamber;

beam through detector means for determining substrate registration relative to a predetermined position and for determining substrate through feature presence;

telecentric beam deflection means for directing the beam substantially perpendicular to the substrate, within a predetermined field of the substrate; and real time digital signal processor (DSP) control means for controlling at least the forming, directing, blanking, positioning, detecting, beam through detector, and deflection means.

25. The system of claim 24 wherein the energy beam source comprises an electron beam source.

26. The system of claim 25 further comprising means for forming, directing, and blanking the beam.

27. The system of claim 26 wherein the vacuum chamber further encloses the beam source.

28. The system of claim 27 wherein the detecting means includes a laser interferometer.

29. The system of claim 28 further comprising dynamic focus and stigmator means for producing a uniform beam within a predetermined field.

30. The system of claim 29 wherein the beam deflection means comprises deflection coils and a telecentric lens.

31. The system of claim 30 further comprising a substrate handling subsystem for storing and transferring the substrate into and out of the vacuum chamber, the handling subsystem including a handling chamber in selective vacuum contact with the vacuum chamber.

32. The system of claim 31 further comprising a computer in communication with the DSP control means, the computer configured to provide substrate machining data and to provide an operator interface to the DSP control means.

33. The system of claim 32 further comprising pattern buffer means for providing high speed substrate machining data memory to the DSP control means, the machining data loaded into the pattern buffer means from the computer.

34. The system of claim 33 wherein the forming means includes a power supply producing a substantially +/−24 V ripple regulated voltage over the voltage range of 60 kV-120 kV.

35. A high precision system for machining substrates comprising:
a source of an energy beam comprising an electron beam source;
an x-y table including means for supporting and positioning a substrate to be machined by said beam;
a vacuum chamber enclosing at least said substrate supporting means of said x-y table;
detecting means for detecting said position of said substrate within said vacuum chamber;
beam through detector means for determining substrate registration relative to a predetermined position and for detecting substrate through feature presence;
telecentric beam deflection means for directing said beam substantially perpendicular to said substrate, within a predetermined field of said substrate;
real time digital signal processor (DSP) control means for controlling at least said forming, directing, blanking, positioning, detecting, beam through detector, and deflection means;
a computer and wherein said DSP control means comprises a plurality of digital signal processor (DSP) cards operatively connected by a VME bus to said computer providing an operator interface, said computer containing at least substrate machining data, memory, and input/output means, said DSP cards further connected to controlled subsystems of said system, and said DSP cards connected to each other by a DSP-DSP bus.

36. The system of claim 25 wherein the control means comprises:
means for calculating deflection distortion correction;
means for calculating x-y table error correction;
means for calculating registration of the substrate relative to a predetermined position error correction;
comparing means for accumulating the distortion correction, the table correction, and the registration correction, and for comparing the accumulated correction with predetermined feature locations; and
correcting means for correcting beam deflection to compensate for the accumulated correction, the correcting means responsive to the comparing means.

37. A method for machining substrates with high precision comprising said steps of:
positioning a substrate on an x-y table;
detecting said position and registration of said substrate;
forming an electron beam opposite to said substrate;
directing said beam at a predetermined, substantially right angle to said substrate, within a predetermined field of said substrate, thereby machining said substrate;
controlling at least said forming, directing, positioning, and detecting with real time digital signal processor (DSP) control,
calculating deflection distortion correction,
calculating x-y table error correction,
calculating registration correction of said substrate relative to a predetermined position error correction;
accumulating said deflection distortion correction, said table error correction and said registration correction yielding the accumulated correction;
comparing said accumulated correction with predetermined feature locations; and
correcting beam deflection to compensate for said accumulated correction responsive to said comparing step.

38. The method of claim 37 wherein the forming step comprises regulating a power supply ripple voltage within +/−24 V over a voltage range of 60 kV-120 kV.

39. The method of claim 38 wherein the forming step further comprises dynamically controlling the beam focus and astigmatism.

40. A method for machining substrates with high precision comprising the steps of:
a) positioning a substrate on an x-y table;
b) detecting the position and registration of said substrate;

c) forming an electron beam opposite to said substrate;
d) directing said beam at a predetermined angle to said substrate, within a predetermined field of said substrate, thereby machining said substrate; and
e) controlling at least the forming, directing, positioning, and detecting with real time digital signal processor (DSP) control,
f) said machining comprising drilling holes in said substrate.

41. The method of claim 40 further comprising selectively pulsing said beam to machine said substrate in response to digital signal processor signals.

42. The method of claim 40 wherein said drilling comprises successively pulsing said beam with predetermined pulse widths to produce a predetermined hole profile in said substrate.

43. The method of claim 42 wherein the successive pulsing comprises
a) applying a first pulse a predetermined pulse width; and
b) applying subsequent pulses of successively increasing pulse widths to complete said drilling of a hole in said substrate.

44. A high precision system for machining substrates comprising:
a source of an energy beam;
an x-y table including means for supporting and positioning a substrate to be machined by the beam;
telecentric beam deflection means for directing the beam at a predetermined angle to the substrate;
real time digital signal processor (DSP) control means for controlling operative subsystems of the system, and
beam through detector means for determining substrate through feature presence.

45. A system in accordance with claim 44, wherein said through detector means includes means for determining substrate registration relative to a predetermined position.

46. A high precision system for machining substrates comprising:
a source of an energy beam comprising an electron beam source;
an x-y table including means for supporting and positioning a substrate to be machined by said beam;
beam deflection means for directing said beam at a predetermined angle to said substrate;
a computer containing at least substrate machining data, memory, and input/output means
real time digital signal processor (DSP) control means for controlling operative subsystems of said high precision system,
said DSP control means comprising a plurality of digital signal processor (DSP) cards operatively connected by a VME bus to said computer providing an operator interface, said DSP cards further connected to controlled subsystems of said system, and said DSP cards connected to each other by a DSP-DSP bus,
a vacuum chamber enclosing at least the substrate supporting means of said x-y table and said beam source,
laser interferometer detecting means for detecting said position of a substrate,
beam through detector means for determining substrate registration relative to a predetermined position and for detecting substrate through feature presence,
dynamic focus and stigmator means for producing a uniform beam within a predetermined field,
said beam deflection means comprises deflection coils and a telecentric lens, and
a substrate handling subsystem for storing and transferring said substrate into and out of said vacuum chamber, said handling subsystem including a handling chamber in selective vacuum contact with said vacuum chamber.

47. A high precision system for machining substrates comprising:
a source of an energy beam comprising an electron beam source;
an x-y table including means for supporting and positioning a substrate to be machined by said beam;
a vacuum chamber enclosing at least said substrate supporting means of said x-y table;
detecting means for detecting said position of said substrate within said vacuum chamber;
beam through detector means for determining substrate registration relative to a predetermined position and for detecting substrate through feature presence;
telecentric beam deflection means for directing said beam substantially perpendicular to said substrate, within a predetermined field of said substrate; and
real time digital signal processor (DSP) control means for controlling at least said forming, directing, blanking, positioning, detecting, beam through detector, and deflection means.

48. A method for machining substrates with high precision comprising the steps of:
positioning a substrate on an x-y table;
detecting the position and registration of said substrate;
forming an electron beam opposite to said substrate;
directing said beam at a predetermined angle to said substrate, within a predetermined field of said substrate, thereby machining said substrate;
controlling at least the forming, directing, positioning, and detecting with real time digital signal processor (DSP) control, and
detecting substrate through feature presence with said beam and a detector means.

49. A method in accordance with claim 47 wherein detecting substrate registration relative to a predetermined position of said substrate.

* * * * *